(12) United States Patent
Lee et al.

(10) Patent No.: US 12,317,683 B2
(45) Date of Patent: May 27, 2025

(54) THIN-FILM TRANSISTOR, DISPLAY APPARATUS INCLUDING THE SAME, AND METHOD OF MANUFACTURING DISPLAY APPARATUS

(71) Applicant: Samsung Display Co., Ltd., Yongin-Si (KR)

(72) Inventors: Jinsuk Lee, Yongin-si (KR); Jin Jeon, Yongin-si (KR); Sugwoo Jung, Yongin-si (KR); Shinbeom Choi, Yongin-si (KR); Youngin Hwang, Yongin-si (KR); Byungno Kim, Yongin-si (KR); Heeyeon Kim, Yongin-si (KR); Kohei Ebisuno, Yongin-si (KR); Nalae Lee, Yongin-si (KR); Illhwan Lee, Yongin-si (KR); Jongmin Lee, Yongin-si (KR); Joohyeon Jo, Yongin-si (KR); Changha Kwak, Yongin-si (KR); Yongseon Jo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/508,151

(22) Filed: Nov. 13, 2023

(65) Prior Publication Data
US 2024/0090265 A1    Mar. 14, 2024

Related U.S. Application Data

(62) Division of application No. 17/034,252, filed on Sep. 28, 2020, now Pat. No. 11,864,421.

(30) Foreign Application Priority Data

Feb. 24, 2020    (KR) .................. 10-2020-0022370

(51) Int. Cl.
H10K 59/121    (2023.01)
H10K 77/10     (2023.01)
(Continued)

(52) U.S. Cl.
CPC ....... H10K 59/1213 (2023.02); H10K 77/111 (2023.02); *H10D 30/6758* (2025.01);
(Continued)

(58) Field of Classification Search
CPC .......... H10K 59/1213; H10K 59/1201; H10K 77/111; H10K 2102/311
See application file for complete search history.

(56) References Cited

U.S. PATENT DOCUMENTS 8,569,754 B2    10/2013    Yamazaki et al.
9,123,707 B2    9/2015    Choi
(Continued)

FOREIGN PATENT DOCUMENTS

EP    3174120 A1    5/2017
JP    1994-175116 A    6/1994
(Continued)

OTHER PUBLICATIONS

S. W. Hsieh, C. Y. Chang, and S. C. Hsu, "Characteristics of low-temperature and low-energy plasma-enhanced chemical vapor deposited SiO2", Journal of Applied Physics 74 (4), Aug. 15, 1993, 11 pages, © 1993 American Institute of Physics.

*Primary Examiner* — Dzung Tran
(74) *Attorney, Agent, or Firm* — Innovation Counsel LLP

(57) ABSTRACT

Provided are a thin film transistor substrate which include a substrate, a buffer layer and a thin film transistor, a display apparatus including the thin film transistor substrate, and a method of manufacturing the display apparatus including the thin film transistor substrate. The buffer layer includes an inorganic insulating layer. An area ratio of a peak corre-
(Continued)

sponding to an N—H bond in the buffer layer is 0.5% or less based on a total peak area in a Fourier transform infrared spectroscopy (FTIR).

8 Claims, 6 Drawing Sheets

(51) Int. Cl.
    *H10D 30/67*     (2025.01)
    *H10D 86/01*     (2025.01)
    *H10D 86/40*     (2025.01)
    *H10D 86/60*     (2025.01)
    *H10K 59/12*     (2023.01)
    *H10K 102/00*     (2023.01)

(52) U.S. Cl.
    CPC ....... *H10D 86/0212* (2025.01); *H10D 86/411* (2025.01); *H10D 86/60* (2025.01); *H10K 59/1201* (2023.02); *H10K 2102/311* (2023.02)

(56) References Cited

U.S. PATENT DOCUMENTS

| | | | |
|---|---|---|---|
| 9,231,070 B2 | 1/2016 | Kakehata et al. | |
| 9,306,071 B2 | 4/2016 | Lee et al. | |
| 2002/0033513 A1 | 3/2002 | Koyama et al. | |
| 2008/0164462 A1 | 7/2008 | Lee et al. | |
| 2009/0159884 A1* | 6/2009 | Oda | H01L 29/4908 438/151 |
| 2011/0278553 A1 | 11/2011 | Kwon et al. | |
| 2012/0045904 A1 | 2/2012 | Choi | |
| 2014/0167032 A1* | 6/2014 | Jo | H01L 29/4908 438/30 |
| 2014/0209877 A1 | 7/2014 | Lee et al. | |
| 2014/0353689 A1 | 12/2014 | Chen et al. | |
| 2015/0060797 A1 | 3/2015 | Lee et al. | |
| 2016/0027854 A1 | 1/2016 | Ku | |
| 2016/0079371 A1 | 3/2016 | Furukawa et al. | |
| 2016/0247903 A1 | 8/2016 | Okazaki et al. | |
| 2019/0252420 A1 | 8/2019 | Lee et al. | |

FOREIGN PATENT DOCUMENTS

| | | |
|---|---|---|
| JP | 1997-289207 A | 11/1997 |
| KR | 10-2014-0002616 A | 1/2014 |
| KR | 10-2014-0097940 A | 8/2014 |
| KR | 10-1432766 B1 | 8/2014 |
| KR | 10-1736925 B1 | 5/2017 |

* cited by examiner

THIN-FILM TRANSISTOR, DISPLAY APPARATUS INCLUDING THE SAME, AND METHOD OF MANUFACTURING DISPLAY APPARATUS

CROSS-REFERENCE TO RELATED APPLICATION

This application is a divisional application of U.S. patent application Ser. No. 17/034,252, filed on Sep. 28, 2020, which claims the benefit of Korean Patent Application No. 10-2020-0022370, filed on Feb. 24, 2020, in the Korean Intellectual Property Office, the disclosures of which are incorporated herein in their entirety by reference.

BACKGROUND

1. Field

One or more embodiments relate to a thin-film transistor, and more particularly, to a thin-film transistor having improved quality of a buffer layer, a display apparatus employing the thin-film transistor and having improved image display quality, and a method of manufacturing the display apparatus.

2. Description of Related Art

Recently, display apparatuses have been used for various purposes. Further, the display apparatuses have been made thinner and lighter, and thus the display apparatuses have been used in many ways.

In order to improve the image quality of a display apparatus, improvement in performance of a thin-film transistor inside the display apparatus is also an important factor.

Therefore, research on improving film quality has been continuously conducted to improve the performance of thin-film transistors.

SUMMARY

One or more embodiments provide a display apparatus in which the content of N—H in a buffer layer of a thin film transistor is controlled to improve image display quality, and a method of manufacturing the display apparatus.

Technical problems to be solved by the present disclosure are not limited to the technical problems mentioned above, and other technical problems not mentioned will be clearly understood by those skilled in the art from the description of the present disclosure.

Additional aspects will be set forth in part in the description which follows and, in part, will be apparent from the description, or may be learned by practice of the presented embodiments of the disclosure.

According to one or more embodiments, a thin film transistor substrate may include a substrate, an active layer disposed on the substrate, a buffer layer disposed between the substrate and the active layer, a source electrode, and a drain electrode, wherein the buffer layer may include an inorganic insulating layer and an area ratio of a peak corresponding to an N—H bond in the material constituting the buffer layer is 0.5% or less based on a total peak area in a Fourier transform infrared spectroscopy (FTIR).

In an embodiment, the inorganic insulating layer may be one of silicon oxide, silicon nitride and silicon oxynitride.

In an embodiment, a content of a compound having an N—H bond in the buffer layer may be 0.5 wt % or less based on a total weight of the buffer layer.

In an embodiment, the buffer layer may be in contact with the active layer, and a content of a compound having an N—H bond in the buffer layer may decrease when a distance from an interface between the buffer layer and the active layer increases.

In an embodiment, an amount of outgassing hydrogen, measured by thermal desorption spectroscopy (TDS) at a temperature of about 500° C. or higher, may be about $9 \times 10^{15}$ ea/cm$^2$ or less.

In an embodiment, a content of defects including Si—N—Si clusters in the buffer layer may be about $7.0 \times 10^{17}$ spins/cm$^3$ or less.

In an embodiment, the buffer layer may have a single-layer structure or a multi-layer structure.

In an embodiment, the thin film transistor substrate may further include a second barrier layer disposed between the substrate and the buffer layer.

In an embodiment, the second buffer layer may include a material different from the buffer layer and includes at least one of silicon oxide and silicon nitride.

In an embodiment, the active layer may include at least one of an organic semiconductor, an inorganic semiconductor, and a silicon semiconductor.

In an embodiment, the thin film transistor substrate may further include a first insulating layer on the active layer, and a gate electrode on the first insulating layer.

In an embodiment, the first insulating layer may be different from the active layer, and may include at least one of $SiO_2$, $SiN_x$, (0<x'<2), SiON, $Al_2O_3$, $TiO_2$, $Ta_2O_5$, $HfO_2$, $ZrO_2$, $Ba_{1-y'-z'}Sr_{y'}Ti_{z'}O_3$(BST)(0<y'<1, 0<z'<1, 0<y'+z'<1), and $PbZr_{w'}Ti_{1-w'}O_3$ (PZT)(0<w'<1).

According to one or more embodiments, a display apparatus may include a thin film transistor including a substrate, an active layer disposed on the substrate, a buffer layer disposed between the substrate and the active layer, a source electrode, and a drain electrode, wherein the buffer layer includes an inorganic insulating layer and an area ratio of a peak corresponding to an N—H bond in the buffer layer is 0.5% or less based on a total peak area in a Fourier transform infrared spectroscopy (FTIR) and a light-emitting device including a first electrode, a second electrode facing the first electrode, and an interlayer between the first electrode and the second electrode.

One of the source electrode and drain electrode of the thin film transistor may be electrically connected to the first electrode of the light-emitting device.

In an embodiment, the interlayer may include a light-emitting layer, and may optionally include at least one of a hole transport layer disposed between the first electrode and the light-emitting layer and an electron transport layer disposed between the light-emitting layer and the second electrode.

According to one or more embodiments, a method of manufacturing a display apparatus includes providing a substrate, forming a buffer layer on the substrate, and forming an active layer on the buffer layer, wherein the buffer layer includes an inorganic insulating layer, and an area ratio of a peak corresponding to a N—H bond in the buffer layer is 0.5% or less based on a total peak area in a Fourier transform infrared spectroscopy (FTIR).

In an embodiment, the forming the buffer layer may be performed by a deposition process, and a power applied for the deposition of the buffer layer may be about 6 KW to about 10 KW.

In an embodiment, the forming the buffer layer may be performed by a deposition process, and process pressure in the deposition process may be about 700 Torr to about 900 Torr.

In an embodiment, the forming the buffer layer may be performed by a deposition process, and a reaction gas in the deposition process may include nitrous oxide ($N_2O$) gas and silane ($SiH_4$) gas.

In an embodiment, a flow ratio of the nitrous oxide ($N_2O$) gas and the silane ($SiH_4$) gas may be about 20:1 to about 35:1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
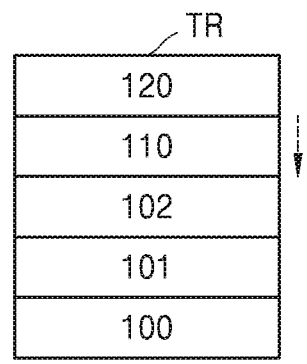
FIG. 1 is a schematic view illustrating a thin-film transistor according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the present disclosure will be described in detail with reference to the accompanying drawings. When a description is made with reference to the drawings, the same or corresponding components will be given the same reference numerals, and redundant description thereof will be omitted.

In the following embodiments, such terms as "first," "second," etc., are not be limited, and terms are used only to distinguish one component from another, not for purposes of limitation.

In the following embodiments, an expression used in the singular encompasses the expression of the plural, unless it has a clearly different meaning in the context.

In the following embodiments, the terms "comprises" and/or "has," when used in this specification, specify the presence of stated features, integers, steps, operations, elements, and/or components, but do not preclude the presence or addition of one or more other features, integers, steps, operations, elements, components, and/or groups thereof.

In the following embodiments, when a component, such as a layer, a film, a region, or a plate, is referred to as being "on" another component, the component may be directly on the other component or intervening components may be present thereon.

In the drawings, the size of components may be exaggerated or reduced for convenience of description. For example, since the size and thickness of each component illustrated in the drawings are arbitrarily illustrated for convenience of description, the present invention is not necessarily limited to those illustrated.

When any embodiment may be implemented differently, a specific process order may be performed differently from the described order. For example, two subsequent processes may be performed substantially simultaneously, or may be performed in an order opposite to that described.

In the following embodiments, assuming that films, regions, components, etc. are connected, this includes not only a case where films, regions, and components are directly connected, but also a case where films, regions, and components are indirectly connected by interposing other films, regions, and components therebetween. For example, in this specification, assuming that films, regions, components, etc. are electrically connected, this includes not only a case where films, regions, and components are electrically connected directly, but also a case where films, regions, and components are electrically connected indirectly by interposing other films, regions, and components therebetween.

FIG. 1 is a schematic view illustrating a thin film transistor according to an embodiment of the present disclosure.

Referring to FIG. 1, a thin film transistor TR includes: a substrate 100; an active layer 120 disposed on the substrate 100; a buffer layer 110 disposed between the substrate 100 and the active layer 120; a source electrode (not shown, refer to FIG. 2); and a drain electrode (not shown, refer to FIG. 2), wherein the buffer layer 110 includes an inorganic insulating layer, for example, silicon oxide, silicon nitride and silicon oxynitride; and the area ratio of a peak corresponding to a N—H bond in the buffer layer is 0.5% or less based on the total peak area in a Fourier transform infrared spectroscopy (FTIR).

The substrate 100 may include various materials such as glass, metal, metal oxide, metal nitride, or plastic. For example, the substrate 100 may include polyethersulfone, polyacrylate, polyetherimide, polyethyelenenapthalate, polyethyeleneterepthalate, polyphenylene sulfide, polyarylate, polyimide, polycarbonate, or cellulose acetate propionate.

The substrate 100 may have flexible, rollable, or bendable characteristics. The substrate 100 may have a multi-layer structure including a plurality of layers, and the layers may include different materials from each other.

The buffer layer 110 may be disposed on the substrate 100 to provide a flat upper surface and function to block impurities from entering into the active layer 120. The buffer layer 110 may be formed as a single layer or multiple layers including an inorganic material such as silicon nitride ($SiN_x$) (0<x<2), and/or silicon oxide ($SiO_y$) (0<y<3).

The buffer layer 110 is disposed adjacent to the active layer 120 while performing the above-described functions, and thus may greatly affect the characteristics of the thin film transistor which is formed using the active layer 120. Therefore, improvement in film quality (roughness) of the buffer layer 110 is important.

However, conventionally, pin holes in the buffer layer 110 having improved film quality are less than that in the buffer layer having ordinary film quality, and thus a large amount of hydrogen is piled up under the active layer 120 during a dehydrogenation process of the active layer 120 because the hydrogen in the active layer 120 cannot out-diffuse through the buffer layer 110 having improved film quality. Accordingly, in an excimer laser annealing (ELA) process of applying an excimer laser when forming the active layer 120, the active layer is damaged due to rapid outgassing of hydrogen through the active layer 120. Such a problem causes pixel defects.

Further, a leakage current in the off current ($I_{off}$) area increases, a gate bias increases due to an increase in electron traps in the buffer layer, and a hot carrier phenomenon occurs, thereby causing a problem of increasing leakage at a drain junction.

In the thin film transistor TR according to an embodiment of the present disclosure, the area ratio of the FTIR peak corresponding to the N—H bond in the entire material constituting the buffer layer 110 is limited to 0.5% or less, thereby solving the aforementioned problem.

That is, when the N—H bond in the above range is maintained in the buffer layer 110, a hydrogen pile up phenomenon under the active layer 120 is suppressed during a dehydrogenation process of the active layer 120, thereby minimizing hydrogen outgassing.

In an embodiment, the content of a compound having a N—H bond in the buffer layer 110 may be 0.5 wt % or less based on the total weight of the buffer layer.

In an embodiment, the buffer layer 110 is in direct contact with the active layer 120, and the content of the compound having a N—H bond in the buffer layer 110 decreases when a distance from an interface between the buffer layer 110 and the active layer 120 increases (in a dotted arrow direction).

Thus, defects of the buffer layer influencing the active layer may be reduced.

In an embodiment, the amount of outgassing hydrogen, measured by thermal desorption spectroscopy (TDS) at a temperature of about 500° C. or higher, may be about $9 \times 10^{15}$ ea/cm² or less.

In an embodiment, the content of defects including Si—N—Si clusters in the buffer layer 110 may be about $7.0 \times 10^{17}$ spins/cm³ or less.

The Si—Ni—Si cluster may act as a defect in the buffer layer 110 to cause problems such as leakage and increase in gate bias at the above-described drain junction. The thin film transistor TR according to an embodiment of the present disclosure may employ the aforementioned configuration, thereby minimize defects.

A threshold voltage $V^{th}$ may be reduced due to the reduction of defects, thus a momentary afterimage of the display apparatus may also be reduced, and a gate bias may be reduced to reduce the defective rate of the display apparatus.

In an embodiment, the buffer layer 110 may have a single-layer structure or a multi-layer structure.

That is, the thin film transistor TR may further include a second buffer layer 102 disposed between the buffer layer 110 and the substrate 100. For example, the second buffer layer may include a material different from the buffer layer, and may include at least one of silicon oxide and silicon nitride.

For example, the buffer layer 110 may include silicon oxide, and the second buffer layer 102 may include silicon nitride.

The active layer 120 may be disposed on the buffer layer 110. The active layer 120 may include at least one of an organic semiconductor, an inorganic semiconductor, and a silicon semiconductor.

In an embodiment, the thin film transistor TR may further include a barrier layer 101 disposed between the substrate 100 and the buffer layer 110.

For example, the barrier layer 101 may be disposed between the second buffer layer 102 and the substrate 100. In this case, the barrier layer 101 may include a material different from the second buffer layer 110.

In an embodiment, the barrier layer 101 may include silicon oxide.

Figure 2:
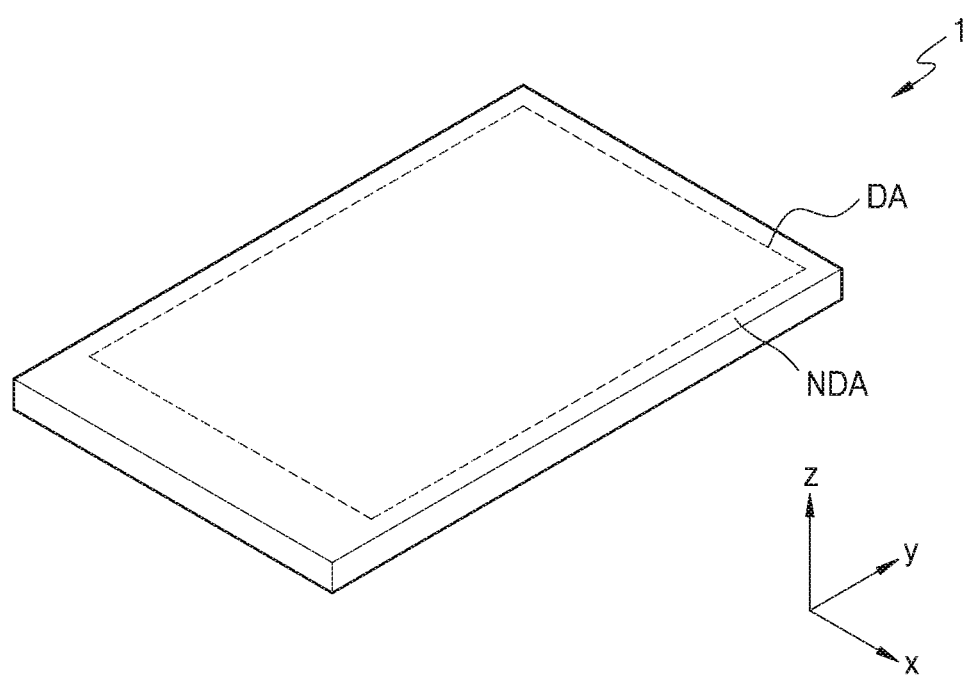
FIG. 2 is a schematic perspective view illustrating a display apparatus according to an embodiment of the present disclosure.

FIG. 2 is a schematic perspective view illustrating a display apparatus according to an embodiment of the present disclosure.

Referring to FIG. 2, a display apparatus 1 includes a display area DA and a non-display area NDA surrounding the display area DA. Various display elements such as an organic light-emitting diode (OLED) may be disposed in the display area DA. Various conductive lines for transmitting electrical signals to be applied to the display area DA including the thin film transistor may be disposed in the non-display area NDA. Although one thin film transistor may be disposed in the non-display area NDA, a plurality of thin film transistors and a plurality of capacitors may be further provided in the non-display area NDA, and scan lines, data lines, and power supply lines which are connected to the thin film transistors may be further provided in the non-display area NDA.

Although FIG. 2 shows the display apparatus 1 having a rectangular display area DA, but the present invention is not limited thereto. The display area DA may have a circular shape, an elliptical shape, or a polygonal shape such as a triangle or a pentagon.

Although it is shown in FIG. 2 that the display apparatus 1 is a flat display apparatus, the display apparatus 1 may be implemented in various forms, such as a flexible, foldable, and rollable forms.

Hereinafter, for convenience of description, as the display apparatus 1 according to an embodiment of the present disclosure, an organic light-emitting display apparatus will be described as an example, but the display apparatus of the present disclosure is not limited thereto. As another embodiment, various types of display apparatus, such as an Inorganic light-emitting display and a quantum dot light-emitting display, may be used.

Figure 3:
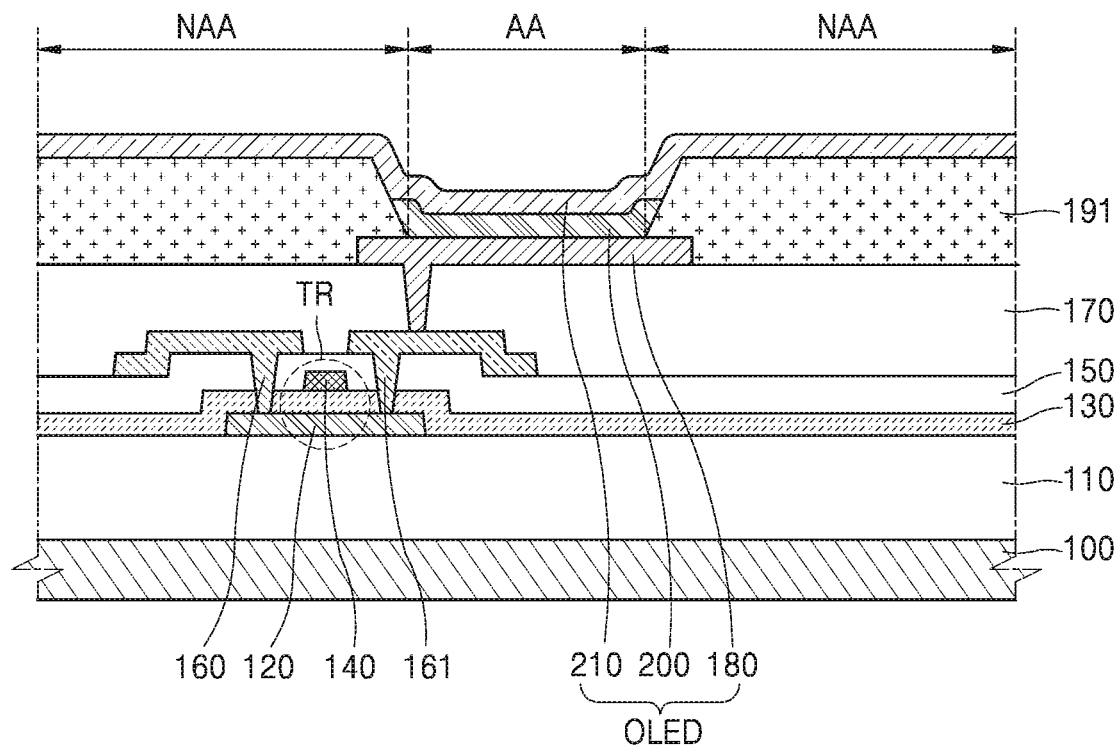
FIG. 3 is a schematic cross-sectional view illustrating a display apparatus according to an embodiment of the present disclosure.

FIG. 3 is a schematic cross-sectional view illustrating a display apparatus according to an embodiment of the present disclosure.

Referring to FIG. 3, the display apparatus 1 according to an embodiment of the present disclosure includes: a light-emitting device OLED including a first electrode 180, a second electrode 210 facing the first electrode 180, and an interlayer 200 between the first electrode 180 and the second electrode 210; and the aforementioned thin film transistor TR. One of the source electrode 160 and drain electrode 161 of the thin film transistor TR is electrically connected to the first electrode 180 of the light-emitting device OLED.

Descriptions of the substrate 100, the buffer layer 110, and the active layer 120 refer to the above descriptions.

In an embodiment, a first insulating layer 130 may be disposed on the active layer 120 to cover the active layer 120, and a gate electrode 140 may be disposed on the first insulating layer 130.

The first insulating layer 130 may be different from the active layer 120, and may include at least one of $SiO_2$, $SiN_x(0<x'<2)$, SiON, $Al_2O_3$, $TiO_2$, $Ta_2O_5$, $HfO_2$, $ZrO_2$, $Ba_{1-y'-z'}Sr_{y'}Ti_{z'}O_3$ (BST)($0<y'<1$, $0<z'<1$, $0<y'+z'<1$), and $PbZr_{w'}Ti_{1-w'}O_3$(PZT)($0<w'<1$). The first insulating layer 130 may be formed as a single layer or multiple layers. The first insulating layer 130 may be an inorganic insulating layer. The first insulating layer 130 may function as a gate insulator (GI).

The gate electrode 140 may be formed as a single layer or multiple layers including aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), copper (Cu), or any combination thereof. The gate electrode 140 may be connected to a gate line that applies an electrical signal to the gate electrode 140.

A source electrode 160 and/or a drain electrode 161 may be disposed on the gate electrode 140 with the second insulating layer 150 disposed therebetween. The source electrode 160 and/or the drain electrode 161 may be electrically connected to the active layer 120 through a contact hole formed in the second insulating layer 150 and the first insulating layer 130. The second insulating layer 150 may function as an interlayer insulating layer.

The second insulating layer 150 may be an inorganic insulating layer. The second insulating layer 150 may be formed as a single layer or multiple layers including at least one selected from $SiO_2$, $SiN_x$, SiON, $Al_2O_3$, $TiO_2$, $Ta_2O_5$, $HfO_2$, $ZrO_2$, BST, and PZT. In another embodiment, the second insulating layer 150 may be an organic insulating layer.

The source electrode 160 may be formed as a single layer or multiple layers including aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), copper (Cu), or any combination thereof. For example, the source electrode 160 may be formed as three layers of Mo/Al/Mo, Mo/Al/Ti, and Ti/Al/Ti. In an alternative embodiment, the source electrode 160 may be formed of Mo/Al/Ti. For a description of the drain electrode 161, refer to the description of the source electrode 160. For example, the source electrode 160 and the drain electrode 161 may be formed of two or more layers.

A third insulating layer 170 may be disposed on the second insulating layer 150. In an embodiment, the third insulating layer 170 may also be disposed on the source electrode 160 and the drain electrode 161. The third insulating layer 170 may have a structure that covers the thin film transistor TR1.

The third insulating layer 170 may be formed as a single organic insulating layer or a plurality of organic insulating layers, each having a flat upper surface. The third insulating layer 170 may include a general-purpose polymer (PMMA or PS), a polymer derivative having a phenol group, an acrylic polymer, an imide polymer, an aryl ether polymer, an amide polymer, a fluorine polymer, a p-xylene polymer, a vinyl alcohol-based polymer, or a blend thereof. For example, the third insulating layer 170 may include polyimide, polyamide, or acrylic resin.

The first electrode 180 of the light-emitting device OLED electrically connected to the thin film transistor TR is provided on the third insulating layer 170. The first electrode 180 may be provided corresponding to the display area DA.

When the light-emitting device OLED is a front light-emitting device, the first electrode 180 may be formed as a reflective electrode. The reflective electrode may include a reflective layer including Ag, Mg, Al, Pt, Pd, Au, Ni, Nd, Jr, Cr, or a compound thereof, and a transparent or translucent electrode layer formed on the reflective layer. When the light-emitting device OLED is a back light-emitting device, the first electrode 180 includes a transparent material such as ITO, IZO, ZnO, or $In_2O_3$, and may be formed as a transparent or translucent electrode.

A fourth insulating layer 191 located on the first electrode 180 and located to contact the third insulating layer 170 from the outside of the first electrode 180 may be provided. The fourth insulating layer 191 may include a second opening exposing at least a portion of the first electrode 180, for example, a central portion thereof. Thus, the fourth insulating layer 191 may serve to define a light-emitting area of a pixel.

The fourth insulating layer 191 may include a siloxane-based polymer, an imide-based polymer, an amide-based polymer, an olefin-based polymer, an acrylic-based polymer, a phenol-based polymer, or any combination thereof.

The light-emitting device OLED may include a first electrode 180 disposed on the third insulating layer 170, a second electrode 210 facing the first electrode 180, and an interlayer 210 disposed between the first electrode 180 and the second electrode 210.

The interlayer 200 may include a light-emitting layer that emits light, and may further include at least one functional layer of a hole injection layer (HIL), a hole transport layer (HTL), an electron transport layer (ETL), and an electron injection layer (EIL). However, the present embodiment is not limited thereto, and various functional layers may be further disposed on the first electrode 180.

The light-emitting layer may be a red light-emitting layer, a green light-emitting layer, or a blue light-emitting layer. Alternatively, the light-emitting layer may have a multilayer structure in which a red light-emitting layer, a green light-emitting layer, and a blue light-emitting layer are stacked to emit white light, or may have a single layer structure including a red light-emitting material, a green light-emitting material, and a blue light-emitting material.

In an embodiment, the interlayer 200 may be provided only in the light-emitting area AA by using a mask having an opening corresponding to the light-emitting area AA of the display apparatus 1, for example, a fine metal mask (FMM).

In another embodiment, the light-emitting layer of the interlayer 200 is provided only in the light-emitting area AA by using a fine metal mask (FMM) having an opening corresponding to the light-emitting area AA of the display apparatus 1, and other functional layers of the interlayer 200 may be provided on the front surfaces of the light-emitting area AA and the non-light-emitting area NAA by using an open mask.

The second electrode 210 may be provided on the interlayer 200. The second electrode 210 may be a reflective electrode, a transparent electrode, or a translucent electrode. For example, the second electrode 210 may include a metal having a small work function, and may include Li, Ca, LiF/Ca, LiF/Al, Al, Ag, Mg, or any combination thereof.

Although not shown in FIG. 3, a counter substrate may be further provided on the second electrode 210. For a description of the counter substrate, refer to the description of the substrate 100.

Although not shown in FIG. 3, a black matrix BM and a color filter CF may be disposed on the surface of the counter substrate facing the substrate 100. The color filter CF may be disposed to correspond to the light-emitting area AA of the display apparatus 1. The black matrix BM may be disposed to correspond to an area except for the light-emitting area AA of the display apparatus 1.

Although not shown in FIG. 3, a protective layer may be further provided between the counter substrate and the second electrode 210. The protective layer may be a single layer or multiple layers of an inorganic layer and/or an organic layer.

Although not shown in FIG. 3, various functional layers may be further provided on the counter substrate. For example, the functional layer may be an anti-reflection layer that minimizes reflection on the upper surface of the counter substrate, or an anti-fouling layer that prevents contamination such as a user's handprint (for example, a fingerprint mark).

In another embodiment, a thin film encapsulation layer, instead of the counter substrate, may be disposed on the substrate 100. The thin film encapsulation layer may include an inorganic encapsulation layer including at least one inorganic material and an organic encapsulation layer including at least one organic material. In some embodiment, the thin film encapsulation layer may be provided as a structure in which a first inorganic encapsulation layer/an organic encapsulation layer/a second inorganic encapsulation layer are stacked.

Hereinafter, a method of manufacturing a display apparatus will be described with reference to FIG. 1.

A method of manufacturing a display apparatus according to an embodiment of the present disclosure includes the steps of: providing a substrate 100; forming a buffer layer 110 on the substrate 100; and forming an active layer 120 on the buffer layer 110, wherein the buffer layer 110 includes at least one of silicon oxide and silicon nitride, and an area ratio of a peak corresponding to a N—H bond in the material constituting the buffer layer is 0.5% or less based on a total peak area in a Fourier transform infrared spectroscopy (FTIR).

Descriptions of the substrate 100, the buffer layer 110, the active layer 120, and the like, refer to the above descriptions.

The step of forming the buffer layer 110 may be performed by a deposition process, and the power applied for the deposition of the buffer layer may be about 6 KW to about 10 KW. As the power applied for the deposition decreases, the content of N—H bonds in the buffer layer 110 decreases.

The step of forming the buffer layer 110 may be performed by a deposition process, and the process pressure in the deposition process may be about 700 Torr to about 900 Torr. As the process pressure decreases, the content of N—H bonds in the buffer layer 110 decreases.

The step of forming the buffer layer 110 may be performed by a deposition process, and the reaction gas in the deposition process may include nitrous oxide ($N_2O$) gas and silane ($SiH_4$) gas.

For example, the flow rate of nitrous oxide ($N_2O$) gas may be about 40000 sccm to about 70000 sccm (standard cubic centimeter per minute). For example, the flow rate of silane ($SiH_4$) gas may be about 1500 sccm to about 3000 sccm. As the flow rate of nitrous oxide gas increases or the flow rate of silane gas decreases, the content of N—H bonds in the buffer layer 110 decreases. The flow ratio of the nitrous oxide ($N_2O$) gas and the silane ($SiH_4$) gas is about 20:1 to about 35:1.

The display apparatus 1 may be implemented as an electronic appliance 1000 such as a mobile phone, a video phone, a smart phone, a smart pad, a smart watch, a tablet PC, a notebook computer, a computer monitor, a television, a terminal for digital broadcasting, a personal digital assistant (PDA), a portable multimedia player (PMP), a head mounted display (HMD), or car navigator.

Figure 4:
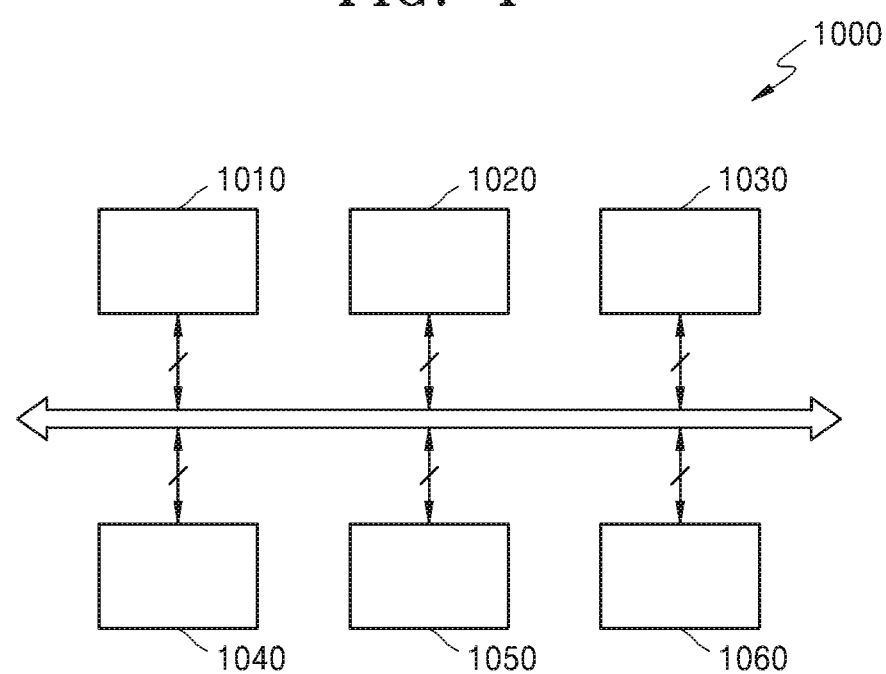
FIG. 4 is a schematic block diagram illustrating the configuration of an electronic appliance according to an embodiment of the present disclosure.
Figure 5A:
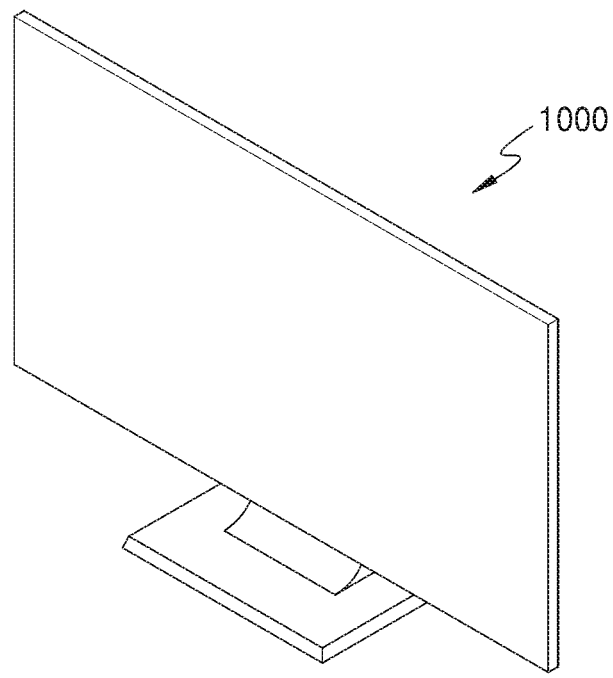
FIGS. 5A and 5B are schematic perspective views illustrating electronic appliances according to an embodiment of the present invention.
Figure 5B:
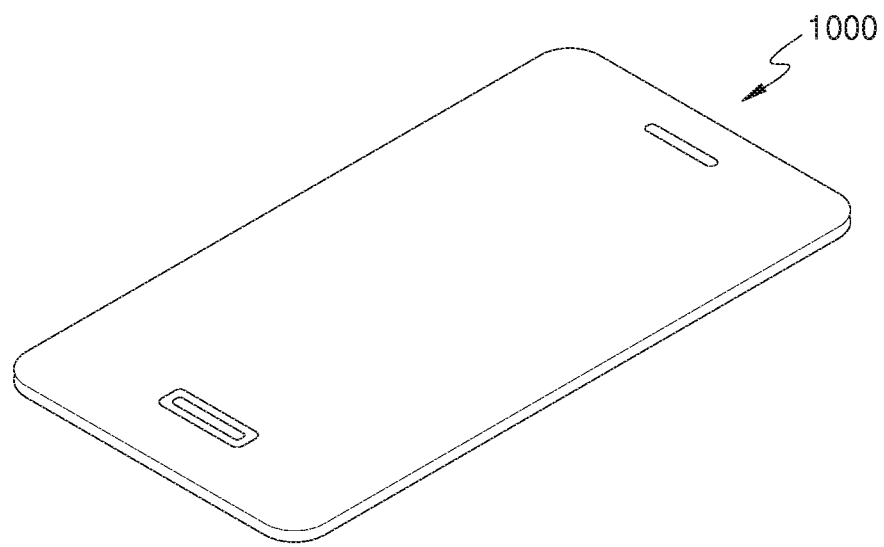

FIG. 4 is a schematic block diagram illustrating the configuration of an electronic appliance according to an embodiment of the present disclosure. FIGS. 5A and 5B are schematic perspective views illustrating electronic appliances according to an embodiment of the present invention.

Referring to FIG. 4, an electronic appliance 1000 may include a processor 1010, a memory 1020, a storage 1030, an input/output 1040, a power supply 1050, and a display apparatus 1060. In this case, the display apparatus 1060 may correspond to the display apparatus 1 of FIG. 2. The electronic device 1000 may communicate with a video card, a sound card, a memory card, or an USB device, or may further include several ports capable of communicating with other systems.

In an embodiment, as shown in FIG. 5A, the electronic appliance 1000 may be implemented as a television. In another embodiment, as shown in FIG. 5B, the electronic appliance 1000 may be implemented as a smart phone. However, these are exemplary, and the electronic appliance 1000 is not limited thereto.

Figure 6A:
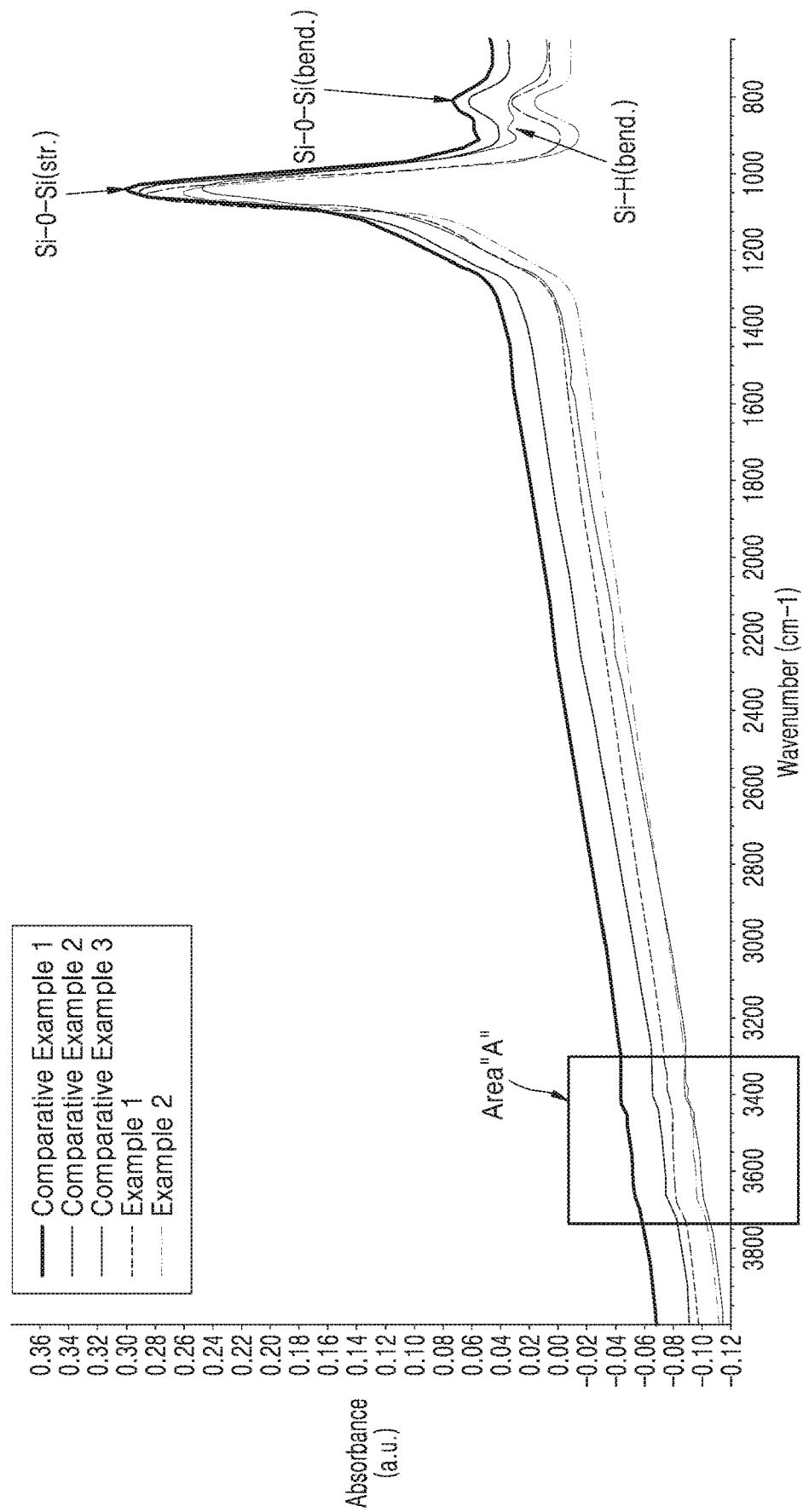
FIG. 6A is a graph analyzing FTIR of Examples 1 to 2 and Comparative Examples 1 to 3.
Figure 6B:
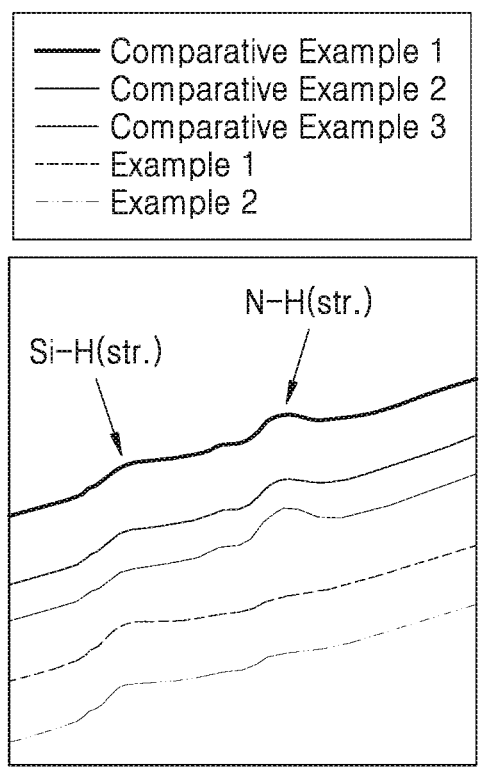
FIG. 6B is an enlarged graph of the N—H peak portion of an area A in the graph of FIG. 6A.

Next, the change in N—H component ratio in a thin film layer according to adjustment of process parameters when manufacturing a thin film transistor will be described with reference to FIGS. 6A to 6C.

The graph represented by Comparative Example 1 is a FTIR graph of Sample 1. In Sample 1, a buffer layer was deposited under the conditions that the power applied for deposition was 5000 W, the process pressure was 900 Torr, the flow rate of $N_2O$ gas was 90000 sccm, and the flow rate of $SiH_4$ gas was 1500 sccm.

The graph represented by Comparative Example 2 is a FTIR graph of Sample 2. In Sample 2, a buffer layer was deposited under the conditions that the power applied for deposition was 6000 W, the process pressure was 900 Torr, the flow rate of $N_2O$ gas was 99000 sccm, and the flow rate of $SiH_4$ gas was 2200 sccm.

The graph represented by Comparative Example 3 is a FTIR graph of Sample 3. In Sample 3, a buffer layer was deposited under the conditions that the power applied for deposition was 6500 W, the process pressure was 1000 Torr, the flow rate of $N_2O$ gas was 80000 sccm, and the flow rate of $SiH_4$ gas was 1800 sccm.

The graph represented by Example 1 is a FTIR graph of Sample 4. In Sample 4, a buffer layer was deposited under the conditions that the power applied for deposition was 8000 W, the process pressure was 1000 Torr, the flow rate of $N_2O$ gas was 60000 sccm, and the flow rate of $SiH_4$ gas was 2000 sccm.

The graph represented by Example 2 is a FTIR graph of Sample 5. In Sample 5, a buffer layer was deposited under the conditions that the power applied for deposition was 7000 W, the process pressure was 900 Torr, the flow rate of N₂O gas was 70000 sccm, and the flow rate of SiH₄ gas was 1600 sccm.

Figure 6C:
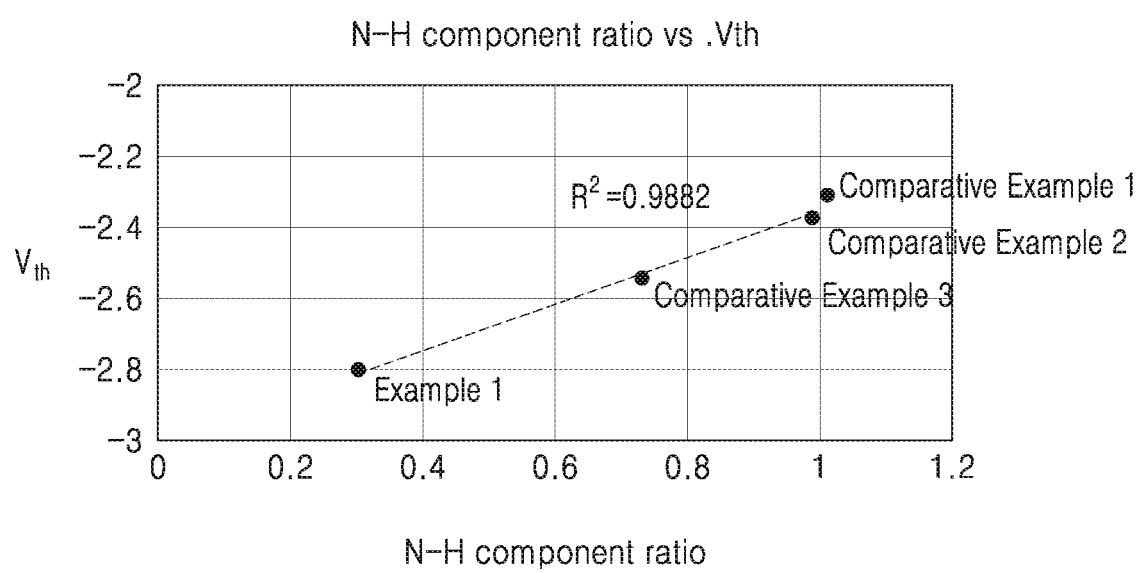
FIG. 6C is a graph for measuring a change in threshold voltage (Vth) according to ratio of an N—H area to a FTIR peak area.

Referring to FIG. 6C, when considering the ratio of an N—H area to a FT-IR peak area, it may be ascertained that the peak value is 0.5 or less only in the graph of Example 1. Referring to FIGS. 6A and 6B, the area of the N—H peak in Example 1 was about 0.18% based on the total peak area, and the area of the N—H peak in Example 2 was about 0.3% based on the total peak area.

That is, the N—H component ratio may be obtained by Equation 1 below:

$$\text{area[N—H]}/(\text{area[Si—O—Si]}+\text{area[Si—H]}+\text{area[N—H]}+\text{area[SiO—H]})\times 100 \qquad <\text{Equation 1}>$$

Moreover, referring to FIG. 6C, it may be ascertained that the Vth value in Example 1 is remarkably lower than those in Comparative Examples 1 to 3.

Next, the change in film quality of the buffer layer according to the change in area ratio of the peak corresponding to the N—H bond in the FTIR analysis spectrum will be described with reference to FIG. 7.

Figure 7:
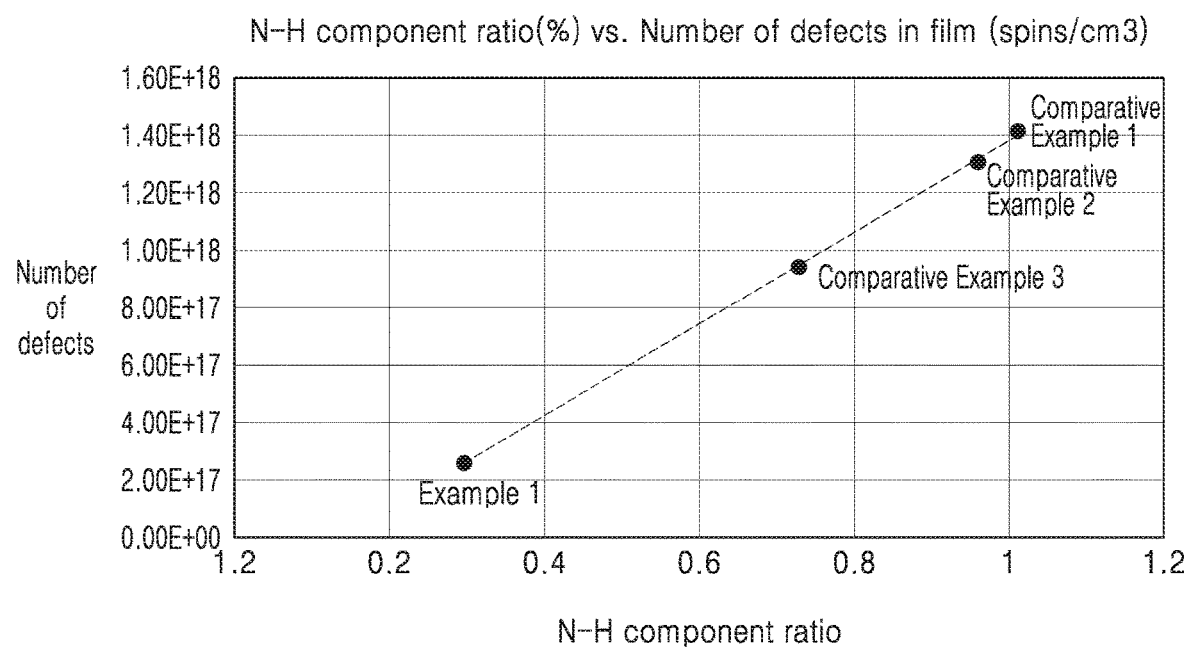
FIG. 7 is a graph illustrating a change in the number of defects in a buffer layer when the area ratios of peaks to NH bonds are 0.3%, 0.54%, 0.73%, 0.99%, and 1.01%, respectively, based on the total peak area in the FTIR analysis spectrum.

Referring to FIG. 7, it may be ascertained that as the area ratio of the peak corresponding to the N—H bond, that is, the N—H component ratio, decreases, the number of defects per unit area of the buffer layer decreases. In particular, it may be ascertained that when N—H component ratio is 0.5% or less, the number of defects remarkably decreases.

Next, the change in the amount of outgassing hydrogen according to the change in area ratio (hereinafter, N—H component ratio) of the peak corresponding to the N—H bond in the FTIR analysis spectrum by TDS analysis will be described with reference to FIG. 8.

Figure 8:
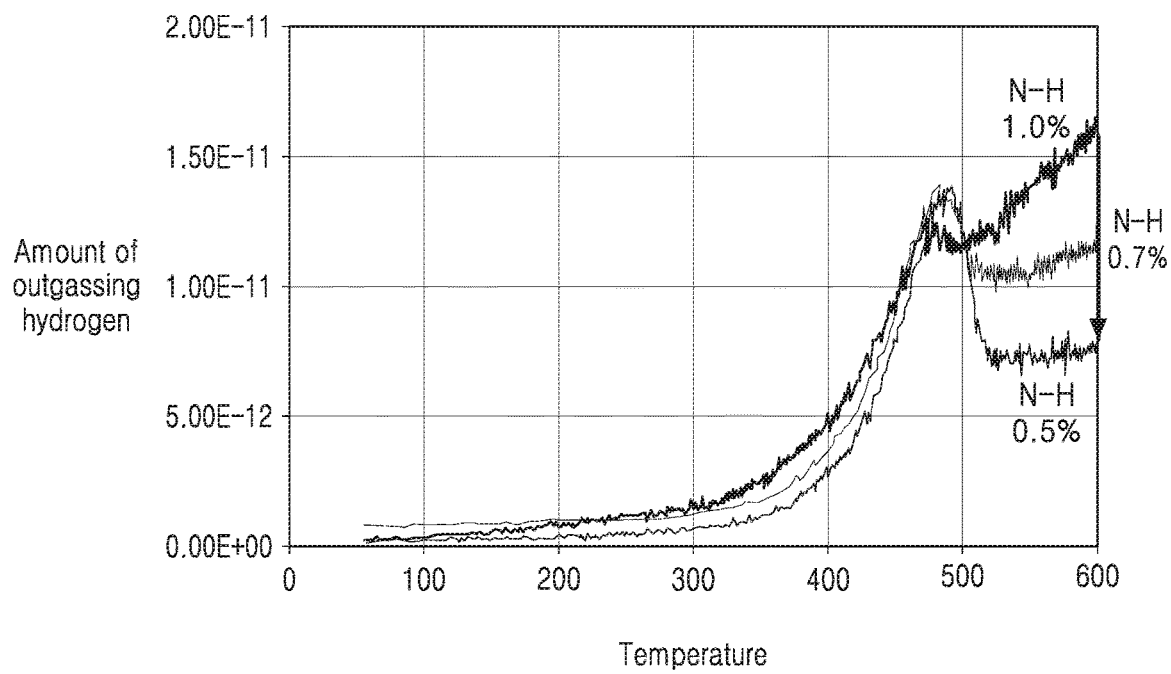
FIG. 8 is a graph illustrating a change in the amount of outgassing hydrogen according to a change in the area ratios (hereinafter, N—H component ratios) of the peaks for the N—H bond in the FTIR analysis spectrum by TDS analysis.

Referring to FIG. 8, it may be ascertained that, first, at low temperature, the difference in the amount of outgassing hydrogen due to the difference in the N—H component ratio is not large However, it may be ascertained that, gradually heating up, the difference in the amount of outgas sing hydrogen is remarkably large at a temperature of 500° C. or higher, the amount of outgassing hydrogen gradually decreases as the N—H component ratio decreases, and the amount of outgas sing hydrogen remarkably decreases when the N—H component ratio is 0.5% or less.

According to various embodiments of the present disclosure, the N—H content in the buffer layer of the thin film transistor may be controlled to reduce defects in the buffer layer and reduce the amount of outgassing hydrogen. Further, the present disclosure may provide a display apparatus in which image display quality is improved, and a method of manufacturing the display apparatus.

However, the above-described effects are exemplary, and effects according to embodiments will be described in detail through the following contents.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a thin film transistor including a substrate, an active layer disposed on the substrate, a buffer layer disposed between the substrate and the active layer and directly contacting the active layer, a source electrode, and a drain electrode, wherein the buffer layer includes an inorganic insulating layer and an area ratio of a peak corresponding to an N—H bond in the buffer layer is 0.5% or less based on a total peak area in a Fourier transform infrared spectroscopy (FTIR); and
a light-emitting device including a first electrode, a second electrode facing the first electrode, and an interlayer between the first electrode and the second electrode,
wherein one of the source electrode and drain electrode of the thin film transistor is electrically connected to the first electrode of the light—emitting device, and
wherein contents of a compound having the N-H bond in the buffer layer decreases when a distance from an interface between the buffer layer and the active layer increases.

2. The display apparatus of claim 1, wherein the interlayer includes a light-emitting layer and optionally includes at least one of a hole transport layer disposed between the first electrode and the light-emitting layer and an electron transport layer disposed between the light-emitting layer and the second electrode.

3. The display apparatus of claim 1, wherein the buffer layer includes a first buffer layer disposed between the active layer and the substrate to direct contact with the active layer and a second buffer layer disposed between the first buffer layer and the substrate.

4. The display apparatus of claim 3, further comprising a barrier layer disposed between the second buffer layer and the substrate.

5. The display apparatus of claim 4, wherein the first buffer layer is silicon oxide.

6. The display apparatus of claim 5, wherein the second buffer layer is silicon nitride.

7. The display apparatus of claim 6, wherein the barrier layer includes a material different from the second buffer layer.

8. The display apparatus of claim 7, wherein the barrier layer is silicon nitride.

* * * * *